(12) United States Patent
Satoh et al.

(10) Patent No.: US 6,919,270 B2
(45) Date of Patent: Jul. 19, 2005

(54) METHOD OF MANUFACTURING SILICON CARBIDE FILM

(75) Inventors: Kiyoshi Satoh, Tama (JP); Kamal Kishore Goundar, Tama (JP)

(73) Assignee: ASM Japan K.K., Tokyo (JP)

( * ) Notice: Subject to any disclaimer, the term of this patent is extended or adjusted under 35 U.S.C. 154(b) by 0 days.

(21) Appl. No.: 10/682,180

(22) Filed: Oct. 9, 2003

(65) Prior Publication Data

US 2004/0076767 A1 Apr. 22, 2004

(30) Foreign Application Priority Data

Oct. 10, 2002 (JP) .................................... 2002-297260

(51) Int. Cl.$^7$ ............................................. H01L 21/44
(52) U.S. Cl. .................... 438/652; 438/778; 438/687; 438/758; 438/769; 438/780; 438/786; 438/790
(58) Field of Search ................. 438/652, 778, 438/687, 758, 769, 780, 786, 790

(56) References Cited

U.S. PATENT DOCUMENTS

| | | | |
|---|---|---|---|
| 4,670,299 A | 6/1987 | Fukuyama et al. | |
| 5,800,878 A | 9/1998 | Yoa | |
| 6,147,009 A | * 11/2000 | Grill et al. ................ | 438/780 |
| 6,187,691 B1 | 2/2001 | Fukuda et al. | |
| 6,211,077 B1 | 4/2001 | Shimizu et al. | |
| 6,235,112 B1 | 5/2001 | Satoh | |
| 6,242,278 B1 | 6/2001 | Shimizu et al. | |
| 6,277,201 B1 | 8/2001 | Nishikawa | |
| 6,312,793 B1 | * 11/2001 | Grill et al. ............... | 428/312.6 |
| 6,383,900 B1 | 5/2002 | Shimizu et al. | |
| 6,436,824 B1 | * 8/2002 | Chooi et al. .............. | 438/687 |
| 6,465,366 B1 | * 10/2002 | Nemani et al. ............ | 438/778 |
| 6,524,955 B2 | 2/2003 | Fukuda et al. | |
| 6,537,928 B1 | 3/2003 | Matsuki et al. | |
| 6,589,888 B2 | 7/2003 | Nemani et al. | |
| 6,635,583 B2 | 10/2003 | Bencher et al. | |
| 6,656,837 B2 | 12/2003 | Xu et al. | |
| 6,668,752 B2 | * 12/2003 | Yao .......................... | 118/723 E |
| 6,764,958 B1 | * 7/2004 | Nemani et al. ............ | 438/758 |
| 6,790,788 B2 | 9/2004 | Li et al. | |
| 2001/0030369 A1 | 10/2001 | MacNeil et al. | |
| 2001/0031563 A1 | 10/2001 | Shioya et al. | |
| 2001/0051445 A1 | 12/2001 | Shioya et al. | |
| 2002/0027286 A1 | 3/2002 | Sundararajan et al. | |
| 2002/0054962 A1 | 5/2002 | Huang | |
| 2003/0049388 A1 | * 3/2003 | Cho et al. .................. | 427/569 |
| 2003/0194496 A1 | * 10/2003 | Xu et al. ................... | 427/255.28 |
| 2004/0067308 A1 | * 4/2004 | Zheng et al. .............. | 427/249.15 |
| 2004/0126929 A1 | 7/2004 | Tang et al. | |

FOREIGN PATENT DOCUMENTS

JP   2001-060584   6/2001

* cited by examiner

*Primary Examiner*—David Zarneke
*Assistant Examiner*—Igwe U. Anya
(74) *Attorney, Agent, or Firm*—Knobbe Martens Olson & Bear, LLP

(57) ABSTRACT

A method for forming a silicon carbide film on a semiconductor substrate by plasma CVD includes (a) introducing a raw material gas containing silicon, carbon, and hydrogen and an inert gas into a reaction chamber at a predetermined mixture ratio of the raw material gas to the inert gas; (b) applying radio-frequency power at the mixture ratio, thereby forming a curable silicon carbide film having a dielectric constant of about 4.0 or higher; and (c) continuously applying radio-frequency power at a mixture ratio which is reduced from that in step (b), thereby curing the silicon carbide film to give a dielectric constant lower than that of the curable silicon carbide film.

16 Claims, 7 Drawing Sheets

METHOD OF MANUFACTURING SILICON CARBIDE FILM

BACKGROUND OF THE INVENTION

1. Field of the Invention

The present invention relates to a deposition method by plasma CVD. More particularly, the present invention relates to a silicon carbide film which acts as an etch stop film used for copper wiring.

2. Description of the Related Art

Conventionally, in LSI devices including CPUs, memories, system LSIs, aluminum alloy has been used for metal interconnects. To insulate aluminum interconnects, a silicon oxide film is used; for some LSI devices, a fluorine-containing silicon oxide film is used.

In recent years, copper which has lower electrical resistivity than aluminum has been adopted as a material for metal wiring to speed up LSI devices'performance, and a carbon-containing silicon oxide film having a low dielectric constant has started to be adopted as an interlayer insulating film to reduce interconnect capacity which causes signal delay. In an LSI device having this copper wiring, an etch stop film is used to form trenches or vias for the copper wiring in a barrier layer of a carbon-containing silicon oxide film. In the past, a silicon nitride film, whose dry etching rate is slower as compared with the carbon-containing silicon oxide film and which has a function to prevent copper diffusion, has been used as an etch stop film. Because a dielectric constant of the silicon nitride film, however, is approximately 7, which is high, a problem that the silicon nitride film increases interconnect capacity on the whole occurs even if the carbon-containing silicon oxide film is applied.

To solve this problem, a technology using a silicon carbide film as an etch stop film was developed as described in, for example, U.S. Pat. No. 5,800,878.

A dielectric constant of a silicon carbide film is approximately 5 and is applied to LSI devices using copper wiring by combining with a carbon-containing silicon oxide film having a dielectric constant of approximately 3.

Typically, what are called silicon carbide films have several different compositions. One of them is a silicon carbide film comprising Si, C, and H. This film has a property of absorbing oxygen or moisture easily and has a shortcoming that its film stress or dielectric constant is changed if it is left in the atmosphere. Additionally, the film has high leakage current and provides poor electrical isolation. To solve these problems, a technology to prevent moisture or oxygen from intruding from a film surface by processing the film surface by an inert plasma gas was developed as described in, for example, U.S. Patent Publication No. 2002-0054962.

This method, however, only improves the quality of the very surface of the film; it does not improve internal characteristics of the SiCH film; the film still has high leakage current and provides poor electrical isolation. The dielectric constant of this film is approximately 4.5 to 5; hence application of the film to current LSI devices aiming to perform faster is difficult.

As silicon carbide films having different compositions, a silicon carbide film comprising Si, C, N, and H, a silicon carbide film comprising Si, C, O, and H, and others were disclosed, for example, in U.S. Patent Publication No. 2001-0030369, U.S. Patent Publication No. 2002-0027286, U.S. Patent Publication No. 2001-0051445, and U.S. Patent Publication No. 2001-0031563.

These silicon carbide films have lower leakage current and provide better electrical isolation as compared with the above-mentioned SiCH film. Particularly, a SiCOH film can attain a low dielectric constant of approximately 4.2 depending on an oxygen ratio. The silicon carbide films have a problem, however, that due to their chemical properties similar to a carbon-containing silicon oxide film, their etching rate difference with the carbon-containing silicon oxide film's becomes small (within 3 to 4 times), lowering their etch stop performance. Particularly, because the SiCOH film whose dielectric constant is lowered by increasing its oxygen content has a chemical composition similar to the carbon-containing silicon oxide film which is used as an insulating film for the interconnects, it is etched at a rate close to an etching rate of the carbon-containing silicon oxide film, making difficult to form vias or trenches for copper wiring to be formed by Reactive Ion Etching (RIE) using $C_4F_8+O_2+Ar$ gas. Additionally, to speed up LSI devices' performance, attaining a low dielectric constant of 4 or lower is demanded for the etch stop film.

SUMMARY OF THE INVENTION

Consequently, an object of the present invention is to provide a method of manufacturing a silicon carbide film having a dielectric constant of about 4 or lower, whose film stress is not changed when it is left in the atmosphere, and which has low leakage current and a dry etching rate extremely lower than the carbon-containing silicon oxide film's and can be used as an etch stop film for copper wiring. Another object of the present invention is to provide a method of manufacturing a silicon carbide film having characteristics suitable for an etch stop film. Still another object of the present invention is to provide a method of manufacturing a silicon carbide film which is stable in the atmosphere and resistant to environmental changes, i.e., maintains its characteristics for a period of time sufficient for practical use. Still another object of the present invention is provide a method of manufacturing a silicon carbide film without complicated processes, preferably without discontinuing film formation processes, and at high efficiency. Yet another object of the present invention is to provide a method of manufacturing a silicon carbide film environmentally stabilized uniformly both in a thickness direction and in a diametrical direction. Still another object of the present invention is to provide a method of manufacturing a semiconductor device using a silicon carbide film as an etch stop layer. Further, another object of the present invention is to provide a method of forming copper wiring in a semiconductor device.

To achieve the above-mentioned objects, the method of manufacturing a silicon carbide film according to the present invention comprises two steps. A first step is of forming a silicon carbide film which is environmentally unstable, uncured, semi-cured, curable, reactive, incomplete, or intermediate (i.e., the film formation reaction is not complete). These terms can be interchangeably used. A second step is of curing the silicon carbide film by completing the film formation reaction. The first step and the second step can be conducted continuously in the same reactor. In the present invention, any suitable types of silicon carbide film can be formed, including the Si—C—H type.

In an embodiment of the present invention, a method for forming a silicon carbide film on a semiconductor substrate by plasma CVD comprises the steps of: (a) introducing a raw material gas containing silicon, carbon, and hydrogen and an inert gas at a predetermined mixture ratio of the raw material gas to the inert gas into a reaction chamber; (b) applying radio-frequency power to a reaction zone inside the reaction chamber at the mixture ratio, thereby forming on a semiconductor substrate a curable silicon carbide film having a dielectric constant of about 4.0 or higher (e.g., 4.0–4.5, preferably 4.0–4.2); and (c) continuously applying radio-frequency power to the reaction zone at a mixture ratio of the raw material gas to the inert gas which is reduced from that in step (b), thereby curing the silicon carbide film to give a dielectric constant lower than that of the curable silicon carbide film (e.g., 3.5–4.0, preferably 3.7–4.0). In the above, steps (a) and (b) correspond to a film formation step (a first step), and step (c) corresponds to a curing step (a second step). The second step is mainly for curing the film, not for forming a film, although a film is formed to the extent that a raw material gas is used in the second step. However, the process conditions themselves can be similar to those in the first step, and the first step and the second step can be continuously conducted. Because the second step is for curing the film, no additional film needs to be deposited on the film in the second step, although deposition of an additional film is not excluded. Through the second step, the film formed in the first step can be fully cured in a thickness direction as well as in a diametrical direction.

In the above, the cured silicon carbide film can be defined as a film having a stress change in the atmosphere or at 400° C. and a leakage current when 1 MV/cm voltage is applied, which are about less than ½ (including ⅓, ¼, ⅕, and ranges including any of the forgoing) of those of the curable silicon carbide film. The curable silicon carbide film can be defined reversely.

In an embodiment, the reduction of the mixture ratio can be accomplished by (i) decreasing the flow rate of the raw material gas, (ii) increasing the flow rate of the inert gas, or (iii) both decreasing the flow rate of the raw material gas and increasing the flow rate of the inert gas. In an embodiment, the mixture ratio is constant before and after a point where the mixture ratio is discontinuously reduced. The change of the mixture ratio can be accomplished discontinuously, i.e., the mixture ratio can be vertically changed if the mixture ratio is the vertical axis and time is the horizontal axis (i.e., no transition period). Alternatively, the change of the mixture ratio can be accomplished at a certain rate by a ramp-up/down method (i.e., linear change) or at a variable rate in a continuous manner (e.g., logarithmic or exponential change). Although a discontinuous mixture ratio reduction is preferable, there are eight combinations with regard to mixture ratio reduction:

|   | Row Material Gas Flow | Inert Gas Flow |
|---|---|---|
| 1 | Constant | Discontinuous Increase |
| 2 | Constant | Continuous Increase |
| 3 | Discontinuous Reduction | Constant |
| 4 | Discontinuous Reduction | Discontinuous Increase |
| 5 | Discontinuous Reduction | Continuous Increase |
| 6 | Continuous Reduction | Constant |
| 7 | Continuous Reduction | Discontinuous Increase |
| 8 | Continuous Reduction | Continuous Increase |

RF power may be applied to the reaction chamber continuously throughout the first and second steps. The other conditions can remain the same throughout the first and second steps. That is, in an embodiment, the second step can be conducted under film formation conditions without sufficient raw material gas supply for actual film formation.

In an embodiment, the mixture ratio of the raw material gas to the inert gas before the reduction (in the first step), is preferably about 1/1 to about 1/3 (including 1/2 and any values between the foregoing), although a range of 1/0.5–1/5 can be used in another embodiment.

In an embodiment, the mixture ratio of the raw material gas to the inert gas after the reduction (in the second step), is preferably about 1/5 to about 1/100, and in another embodiment, close to zero (including 1/10, 1/20, 1/30, 1/40, 1/50, 1/80, 1/200, 1/500, 1/1000, and any values between the foregoing). In another embodiment, the mixture ratio of the raw material gas to the inert gas after the reduction is about zero. Preferably, the flow of the inert gas continuously or discontinuously increases, whereas the flow rate of the raw material gas gradually decreases to zero (i.e., continuous reduction or give rate reduction). In the above, the mixture rate after the reduction means the final mixture rate in the second step.

The raw material gas may include, but is not limited to, organo-silane such as tetramethylsilane or trimethylsilane. The inert gas may include, but is not limited to, helium, argon, neon, xenon or krypton.

In an embodiment, the method may further comprise stabilizing the reaction zone prior to the film formation (before the first step), wherein the flow rate of the raw material gas and the flow rate of the inert gas are increased from zero until reaching a predetermined mixture ratio by a ramp-up method.

Further, the radio-frequency power may be comprised of low frequency power and high-frequency power. In an embodiment, low frequency power is power having a frequency of less than 2 MHz and high frequency power is power having a frequency of no less than 2 MHz. In another embodiment, the low-frequency power is applied in the range of about 10 W to about 600 W (including 50 W, 100 W, 200 W, 300 W, 400 W, 500 W, and any values between the foregoing), whereas the high-frequency power is applied in the range of about 100 W to about 2000 W (including 200 W, 500 W, 700 W, 1000 W, 1500 W, and any values between the foregoing), wherein the low-frequency power is lower than the high-frequency power.

In an embodiment, a time period for the curing (the second step) may be about 5 seconds to about 10 seconds per the curable silicon carbide film having a thickness of about 30 nm to about 100 nm. The time period may vary depending on the thickness of the film, the degree of completion of film formation reaction, etc. The time period per thickness of 10 nm may be about 0.5–5 seconds, including 1, 2, 3, 4, and any values between the foregoing. The thickness of the film is not limited to but may be in the range of 10–1000 nm depending on the intended purpose of the film.

The flow rate of the raw material gas and the flow rate of the inert gas before the reduction of the mixture ratio are about 100 sccm to about 1,000 sccm and about 100 sccm to about 3,000 sccm, respectively.

The silicon carbide film can be used as an etch stop layer, a hard film, a cap layer, or other films for various purposes.

In another aspect, the present invention provides a method for forming a silicon carbide film on a semiconductor substrate by plasma CVD, comprising the steps of: (I) forming a curable silicon carbide film having a dielectric constant of more than about 4.0 on a semiconductor substrate placed in a reaction chamber, by introducing a raw material gas containing silicon, carbon, and hydrogen at a given flow rate, and an inert gas at a given flow rate into the reaction chamber, and applying radio-frequency power to a reaction zone inside the reaction chamber; and (II) curing the silicon carbide film having a dielectric constant of no more than about 4.0 by discontinuously or continuously reducing and then maintaining a mixture ratio of the raw material gas to the inert gas while continuously applying radio-frequency power to the reaction zone.

In the above, the reduction of the mixture ratio may be accomplished by (i) decreasing the flow rate of the raw material gas, (ii) increasing the flow rate of the inert gas, or (iii) both decreasing the flow rate of the raw material gas and increasing the flow rate of the inert gas. Further, the mixture ratio may be constant before and after a point of the mixture ratio's discontinuous reduction. The silicon carbide film may be an etch stop film.

In still another aspect, the present invention provides a method for forming an interconnect on a semiconductor substrate by plasma CVD, comprising the steps of: (a) forming a dielectric film on a semiconductor substrate using a gas containing silicon, carbon, oxygen, and hydrogen and optionally an inert gas by plasma CVD; (b) forming as an etch stop layer a silicon carbide film on the dielectric film according to claim 1; and (c) subjecting the substrate to etching for copper wiring. In the above, the dielectric film may be made of a Si—C—O—H material, and etch stop layer may be made of a Si—C—H material.

For purposes of summarizing the invention and the advantages achieved over the prior art, certain objects and advantages of the invention have been described above. Of course, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught herein without necessarily achieving other objects or advantages as may be taught or suggested herein.

Further aspects, features and advantages of this invention will become apparent from the detailed description of the preferred embodiments which follow.

BRIEF DESCRIPTION OF THE DRAWINGS

These and other features of this invention will now be described with reference to the drawings of preferred embodiments which are intended to illustrate and not to limit the invention.

Explanation of symbols used is as follows: 1: Plasma CVD equipment; 2: Reaction chamber; 3: Susceptor; 4: Showerhead; 5: Heater; 6: Piping; 7: Valve; 8, 8': Radio-frequency oscillators; 9: Semiconductor substrate; 10: Matching circuit; 11: Valve; 12: Piping; 13: Gas inlet port; 14: Mass flow controller; 15: Valve; 16: Gas inlet port; 17: Remote plasma chamber; 18: Piping; 19: Piping; 20: Exhaust port; 21: Conductance regulating valve; 22: Pressure controller; 23: Pressure gauge; 24: Sheath heater; 25: Thermocouple; 26: Temperature controller; 27: Ground; 28: Opening portion; 29: Gas inlet port; 30: Gate valve.

DETAILED DESCRIPTION OF THE PREFERRED EMBODIMENT

The present invention will be described in detail below with reference to preferred embodiments. However, the present invention simply includes these embodiments and should not be limited thereto.

The present invention is applied to various embodiments including, but not limited to, the following:

A method of manufacturing a silicon carbide film on a semiconductor wafer by plasma CVD comprises the steps of: bringing gases comprising a raw material gas containing silicon, carbon, and hydrogen at a given flow rate and an inert gas at a given flow rate into a reaction chamber, applying at least one type of radio-frequency power to a reaction zone inside the reaction chamber and changing a mixture ratio of the raw material gas and the inert gas included in the gases while at least one type of radio-frequency power is applied.

Specifically, the step of changing the mixture ratio may comprise a step of decreasing only a flow rate of the raw material gas discontinuously, increasing only a flow rate of the inert gas discontinuously, or decreasing a flow rate of the raw material gas discontinuously and at the same time as increasing a flow rate of the inert gas discontinuously.

In this case, a flow ratio of the inert gas to the raw material gas after the mixture ratio is changed may be about 5 to about 100.

Alternatively, the step of changing the mixture ratio may comprise a step of decreasing only a flow rate of the raw material gas continuously, increasing only a flow rate of the inert gas continuously, or decreasing a flow rate of the raw material gas continuously and at the same time as increasing a flow rate of the inert gas continuously.

In this case, a flow rate of the raw material gas may reduce continuously to zero.

Figure 1:
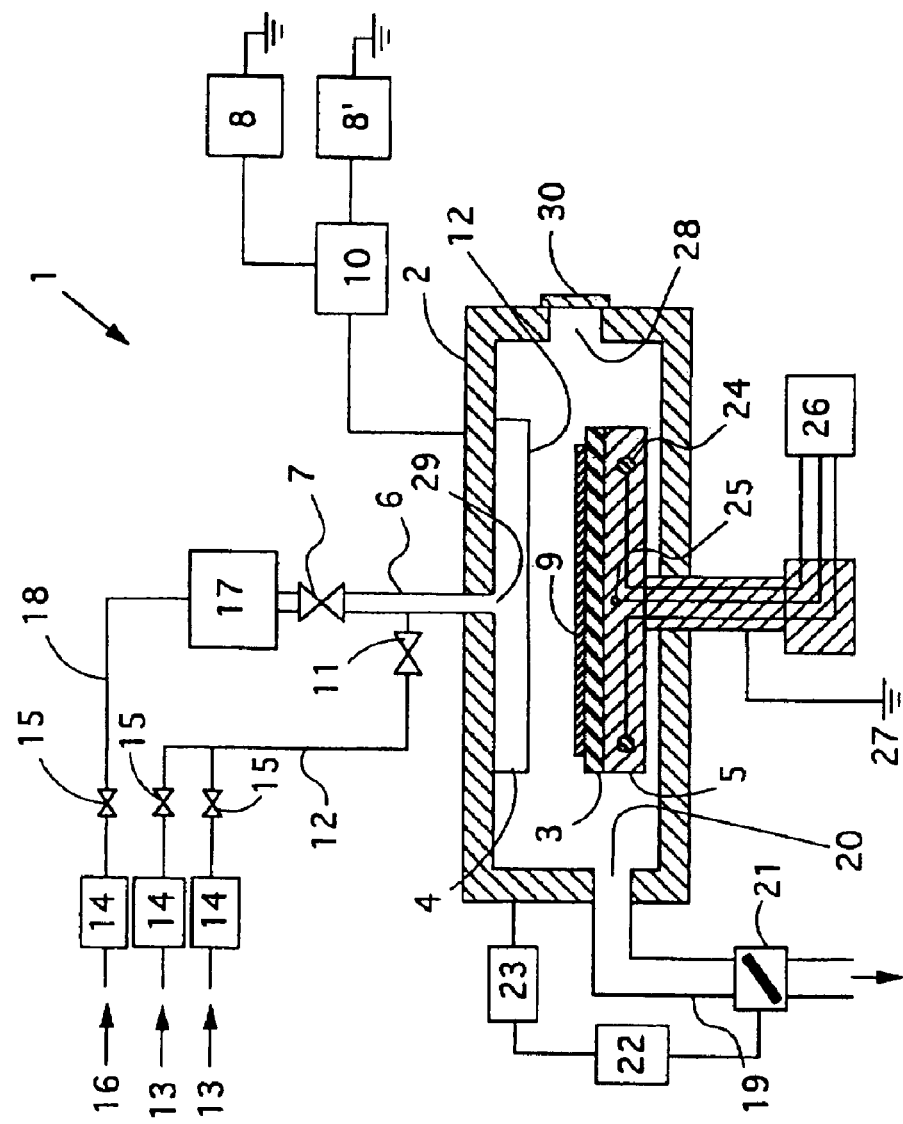
FIG. 1 is a schematic view showing a plasma CVD apparatus usable in the present invention.

The present invention is described further in detail with referent to the drawings. FIG. 1 shows a schematic view of plasma CVD equipment used for the method of depositing a silicon carbide film on a semiconductor substrate according to an embodiment of the present invention. A plasma CVD apparatus 1 comprises a reaction chamber 2, a susceptor 3 provided inside the reaction chamber and used for holding a semiconductor substrate thereon and a showerhead 4 set up opposing to a susceptor 3 and used for emitting a jet of reaction gases equally to a semiconductor substrate 9.

On a sidewall of the reaction chamber 2, an exhaust port 20 used for evacuating the reaction chamber 2 is provided, which is connected to a vacuum pump (not shown) via piping 19. Between the exhaust port 20 and the vacuum pump, a conductance regulating valve 21 for regulating a pressure inside the reaction chamber 2 is set up. The conductance regulating valve 21 is electrically connected to a pressure gauge 23 for measuring a pressure inside the reaction chamber via a pressure controller 22.

Additionally, on the sidewall of the reaction chamber 2, an opening portion 28 is provided. The opening portion 28 is connected to a handling chamber (not shown) for bringing/carrying out the semiconductor substrate 9 via a gate valve 30 into/from the reaction chamber 2.

Below the susceptor 3, an aluminum alloy heater 5 for heating the semiconductor substrate 9 is provided. Inside the aluminum alloy heater 5, a resistance heating type sheath heater 24 and a thermocouple 25 are embedded and are connected to a temperature controller 26 for controlling a temperature of the semiconductor substrate 9 at a given temperature. The susceptor 3 and the aluminum alloy heater 5 are grounded 27 to form one electrode for plasma discharge. In place of the susceptor 3 and the aluminum alloy heater 5, a ceramic heater can also be used. In this regard, the ceramic heater can also be used as a susceptor so as to hold the semiconductor substrate directly. The ceramic heater comprises a ceramic base produced by integrating a resistance heating type heater into the base by sintering. As a material of the ceramic base, a ceramic nitride or oxide resistant to fluoric or chloric activated species can be used. Preferably, the ceramic base comprises aluminum nitride, but can comprise aluminum oxide or magnesium oxide.

Inside the reaction chamber 2, the showerhead 4 is set up at a position opposing to the susceptor 3. In an undersurface 12 of the showerhead 4, about 1,000 to about 5,000 fine pores (not shown) with a diameter of about 0.5 mm to about 1.0 mm for emitting a jet of a gas evenly to the semiconductor substrate 9 are provided. The showerhead 4 is electrically connected to radio-frequency oscillators (8, 8') preferably via a matching circuit 10 and serves as the other electrode for plasma discharge. Here, by connecting the radio-frequency oscillators to the susceptor 3, grounding the showerhead 4 can be achieved. The radio-frequency oscillators (8, 8') respectively generate two different types of radio-frequency power 13 MHz or higher (normally in industrial practice, 13.56 MHz or 27.12 MHz) and 100 kHz to 1 MHz (preferably 300 kHz to 400 kHz). These two types of radio-frequency power are synthesized inside the matching circuit 10 and are supplied to the showerhead 4. Reaction gases (gases comprising a raw material gas and an inert gas) supplied to a reaction space over the semiconductor substrate 9 from the showerhead 4 are excited and decomposed by plasma discharge formed by radio-frequency power applied to the showerhead 4 and deposit a thin film on the semiconductor substrate 9.

In nearly the center of the upper surface of the showerhead 4, a gas inlet port 29 is provided. Piping 6 is connected to the gas inlet port 29. Upstream of the piping 6, a remote plasma chamber 17 is connected via a valve 7. Piping 18 is further connected to the remote plasma chamber 17. Upstream of the piping 18, a valve 15 and a mass flow controller 14 are connected. The end of the piping 18 is formed as a cleaning gas inlet port 16. According to the type of cleaning gas, the number of gas inlet ports 16 is determined. Fed from the gas inlet port 16 with its flow rate controlled by the mass flow controller 14 at a given flow rate, a cleaning gas is activated in the remote plasma chamber 17 to clean inside the reaction chamber 2.

Piping 12 is connected in a position between the gas inlet port 29 of the piping 6 and the valve 7 via a valve 11. Upstream of the piping 12, the valve 15 and the mass flow controller 14 are connected. The end of the piping 12 is formed as raw material gas inlet ports 13. According to types of reaction gases, the number of gas inlet ports 13 is determined. Fed from the gas inlet ports 13 with their respective flow rates controlled by the mass flow controller 14 at a given flow rate, various gases are mixed while flowing through the piping 12 and the piping 6 and are supplied to the showerhead 4 via the gas inlet port 29.

Figure 2:
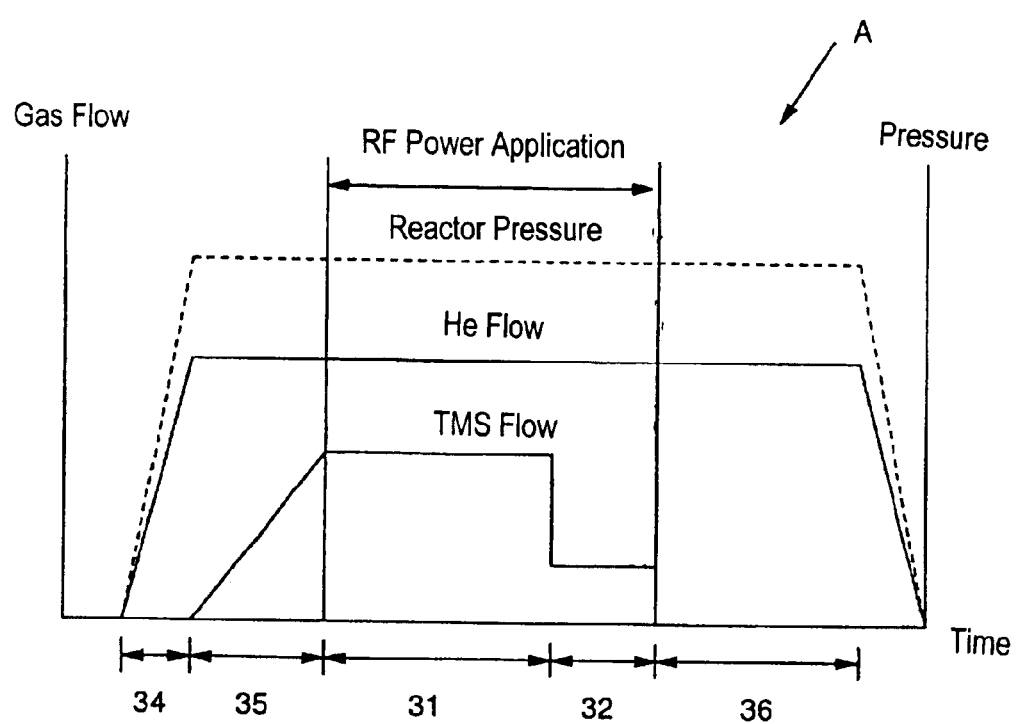
FIG. 2 is a diagram showing film formation control sequences (Sequence A) used for manufacturing a silicon carbide film according to an embodiment of the present invention.

The method of manufacturing a silicon carbide film on the semiconductor substrate according to an embodiment of the present invention is described below. FIG. 2 shows a preferred embodiment of a deposition control sequence used in the method of manufacturing the silicon carbide film according to the present invention. The Sequence A comprises reaction gas introduction steps (34, 35), deposition steps (31, 32) and a purge step 36.

The reaction gas introduction steps comprise an inert gas introduction step 34 and a raw material gas introduction step 35. After a semiconductor substrate 9 is brought inside the reaction chamber 2 and is heated at a given temperature (preferably at about 300° C. to about 400° C., more preferably at about 320° C. to about 350° C.), an inert gas (preferably, helium) whose flow rate is controlled within the range of about 100 sccm to about 3,000 sccm is brought into the reaction chamber 2 in the inert gas introduction step 34. In place of helium, argon, neon, xenon or krypton can be used as an inert gas. By using argon or a mixture gas of argon and helium as an inert gas, a film having high film stress and high film density can be formed. With the inert gas brought in, a pressure inside the reaction chamber 2 is regulated at a determined value within the range of about 100 Pa to about 1000 Pa (preferably, about 400 Pa to about 700 Pa). Subsequently, in the raw material gas introduction step 35, a raw material gas (preferably, tetramethylsilane ($Si(CH_3)_4$)) whose flow rate is controlled within the range of about 100 sccm to about 1,000 sccm is brought into the reaction chamber 2. Here, as a raw material gas, trimethylsilane can also be used. In the reaction gas introduction step, a ratio of an inert gas to a raw material gas brought in is preferably about 1 to about 3. When the reaction gases are brought into the reaction chamber, a method of ramping up a flow rate from zero to a prescribed value during designed period of time is adopted. This is to prevent particles from floating due to a pressure rise inside the reaction chamber caused by sudden gas inflow and consequently adhering to the semiconductor substrate 9.

Succeeding deposition steps comprise the first deposition step 31 and the second deposition step 32. A ratio of reaction gases in the first deposition step is preferably about 200 sccm to about 500 sccm of tetramethylsilane to about 300 sccm to about 1500 sccm of He; more preferably about 200 sccm to about 500 sccm of tetramethylsilane to about 300 sccm to about 600 sccm of He. After stabilization of a reaction gas flow rate and a pressure inside the reaction chamber has been confirmed, two types of radio-frequency power of 27.12 MHz and 400 kHz are applied within the range at about 200 W to about 1,000 W and at about 50 W to about 500 W respectively (preferably at about 300 W to about 600 W and at about 100 W to about 300 W respectively) to the showerhead 4. Using radio-frequency power of 27.12 MHZ has effect to reduce plasma damage and electrostatic charge caused by plasma to the semiconductor substrate 9. 13.56 MHz can be used as a frequency of relatively higher radio-frequency power. The execution time of the first deposition step 31 is determined based on the time calculated from a targeted film thickness of a silicon carbide film and a deposition rate (preferably, about 100 nm/min to about 200 nm/min). In the first deposition step 31, a silicon carbide base film having a dielectric constant of about 4.0 to about 4.2 is formed on the semiconductor substrate 9. Although this silicon carbide base film has a lower dielectric constant than conventional silicon carbide films, its film characteristics are changed by absorbing moisture or oxygen or reacting to them if it is left as it is because its film-formation reaction is unfinished. Consequently, after pursuing research work earnestly, the inventors of the present invention found a method to solve these problems by executing the second deposition step described below subsequently to the first deposition step.

The second deposition step 32 is executed subsequently to the first deposition step 31. In the second deposition step 32, the radio-frequency power and a reaction chamber pressure applied are the same as in the first deposition step. In the second deposition step 32, while a flow rate of He is kept at a fixed flow, only a flow rate of tetramethylsilane is decreased discontinuously up to the range of about 20 sccm to about 600 sccm. In the second deposition step 32, a flow ratio of He to tetramethylsilane is about 5 or more (preferably from about 5 to about 15). The execution time of the second deposition step 32 is at least about 3 seconds; for a film thickness from 30 nm to 100 nm which is a typically requested film thickness of a silicon carbide film, the execution time is preferably from about 5 seconds to about 10 seconds. Thus, by executing a deposition reaction by changing a mixture ratio of reaction gases in the second deposition step 32, the reaction of the silicon carbide base film formed in the first deposition step 31 has been carried through and change of film characteristics over time is stopped.

After the second deposition 32 is completed, application of the radio-frequency power to the showerhead 4 is stopped in the purge step 36 and at the same time feeding of tetramethylsilane is also stopped. He gas is continuously fed into the reaction chamber 2 and remaining tetramethylsilane or its decomposition products' volatile components are evacuated outside the reaction chamber.

Figure 3:
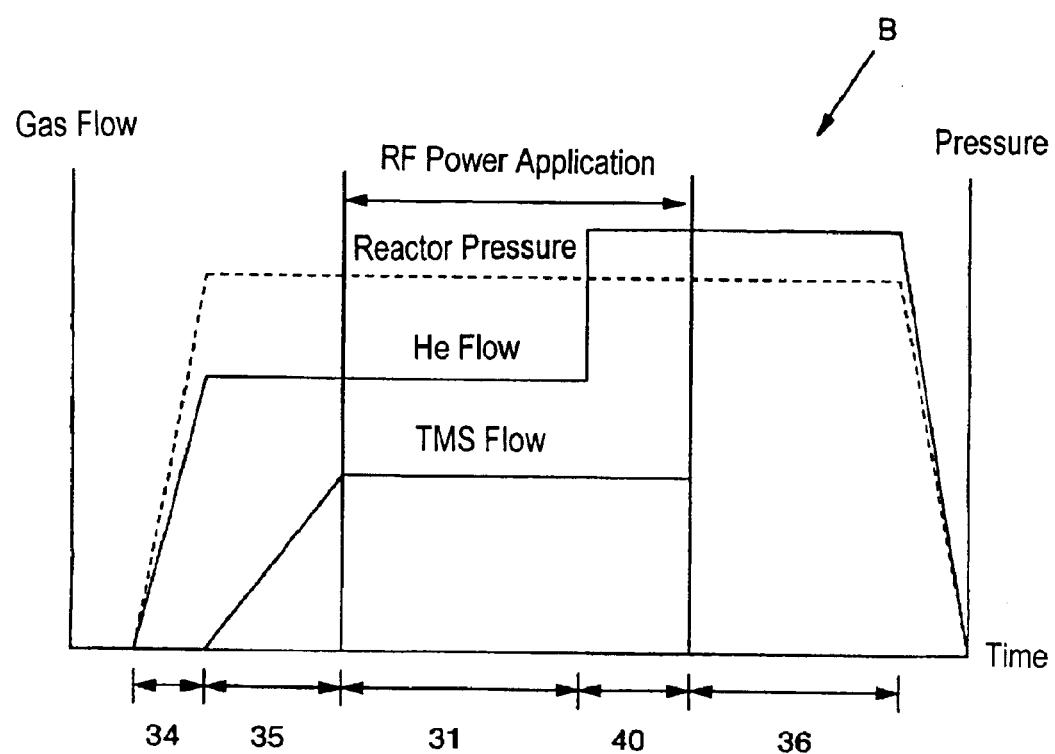
FIG. 3 is a diagram showing film formation control sequences (Sequence B) used for manufacturing a silicon carbide film according to another embodiment of the present invention.

FIG. 3 shows another embodiment of a deposition sequence used in the method of manufacturing the silicon carbide film according to the present invention. The Sequence B comprises reaction gas introduction steps (34, 35), deposition steps (31, 40) and a purge step 36. Because the reaction gas introduction steps and the purge step are the same as in the Deposition Sequence A shown in FIG. 2, descriptions are omitted. The deposition step of the Deposition Sequence B shown in FIG. 3 comprises the first deposition step 31 and the second deposition step 40. The first deposition step 31 is the same as the first deposition step 31 of the Deposition Sequence A. As for the Deposition Sequence B, in the second deposition step 40, while a flow rate of tetramethylsilane is kept at a fixed flow, by increasing only a flow rate of He discontinuously, a mixture ratio of the reaction gases is changed. Specifically, in the first deposition step 31, a mixture ratio of the reaction gases is about 100 sccm to about 1,000 sccm of tetramethylsilane to about 100 sccm to 3,000 sccm of He; in the second deposition step 40, a mixture ratio is about 100 sccm to about 1,000 sccm of tetramethylsilane to about 500 sccm to about 10,000 sccm of He. Preferably, in the first deposition step 31, a mixture ratio of the reaction gases is about 200 sccm to about 500 sccm of tetramethylsilane to about 300 sccm to about 1,500 sccm of He; in the second deposition step 40, a mixture ratio is about 200 sccm to about 500 sccm of tetramethylsilane to about 1,000 sccm to about 5,000 sccm of He. More preferably, in the first deposition step 31, a mixture ratio of the reaction gases is about 200 sccm to about 500 sccm of tetramethylsilane to about 300 sccm to about 600 sccm of He; in the second deposition step 40, a mixture ratio is about 200 sccm to about 500 sccm of tetramethylsilane to about 1,500 sccm to about 3,000 sccm of He. In the second deposition step 40, a flow ratio of He to tetramethylsilane is about 5 or more (preferably from about 5 to about 10).

Figure 4:
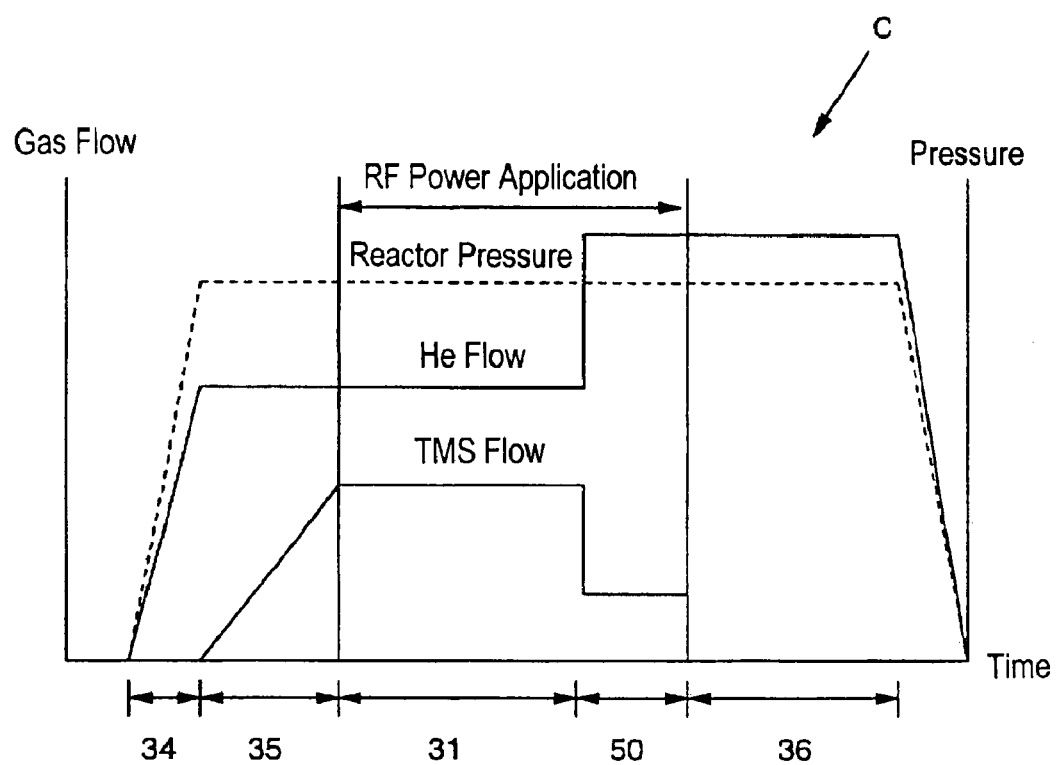
FIG. 4 is a diagram showing film formation control sequences (Sequence C) used for manufacturing a silicon carbide film according to another embodiment of the present invention.

FIG. 4 shows a third embodiment of a deposition sequence used in the method of manufacturing the silicon carbide film according to the present invention. The Deposition Sequence C comprises reaction gas introduction steps (34, 35), deposition steps (31, 50) and a purge step 36. Because the reaction gas introduction steps and the purge step are the same as in the Deposition Sequence A shown in FIG. 2, descriptions are omitted. The deposition step of the Deposition Sequence C shown in FIG. 4 comprises the first deposition step 31 and the second deposition step 50. The first deposition step 31 is the same as the first deposition step 31 of the Deposition Sequence A. As for the Deposition Sequence C, in the second deposition step 50, by decreasing a flow rate of tetramethylsilane discontinuously and at the same time increasing a flow rate of He discontinuously, a mixture ratio of the reaction gases is changed. Specifically, in the first deposition step 31, a mixture ratio of the reaction gases is about 100 sccm to about 1,000 sccm of tetramethylsilane to about 100 sccm to about 3,000 sccm of He; in the second deposition step 50, a mixture ratio is about 20 sccm to about 600 sccm of tetramethylsilane to about 500 sccm to about 1,0000 sccm of He. Preferably, in the first deposition step 31, a mixture ratio of the reaction gases is about 200 sccm to about 500 sccm of tetramethylsilane to about 300 sccm to about 1,500 sccm of He; in the second deposition step 50, a mixture ratio is about 30 sccm to about 100 sccm of tetramethylsilane to about 1,000 sccm to about 5,000 sccm of He. More preferably, in the first deposition step 31, a mixture ratio of the reaction gases is about 200 sccm to about 500 sccm of tetramethylsilane to about 300 sccm to about 600 sccm of He; in the second deposition step 50, a mixture ratio is about 30 sccm to about 50 sccm of tetramethylsilane to about 1,500 sccm to about 3,000 sccm of He. In the second deposition step 50, a flow ratio of He to tetramethylsilane is about 16 or more (preferably from about 30 to about 60).

Figure 5:
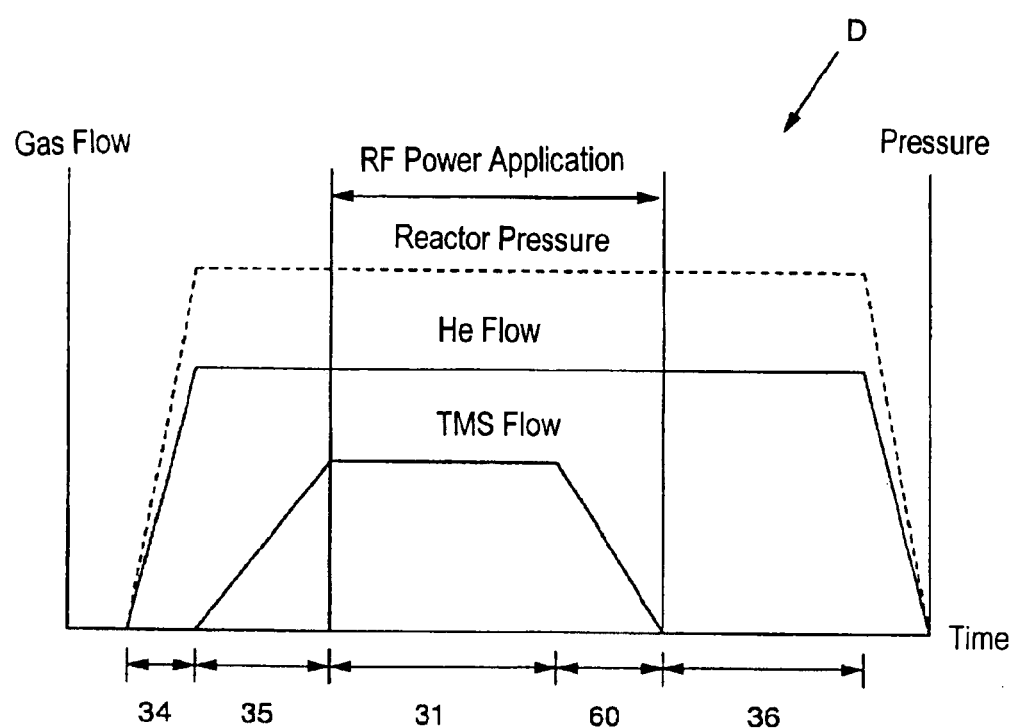
FIG. 5 is a diagram showing film formation control sequences (Sequence D) used for manufacturing a silicon carbide film according to another embodiment of the present invention.

FIG. 5 shows a fourth embodiment of a deposition sequence used in the method of manufacturing the silicon carbide film according to the present invention. The Deposition Sequence D comprises reaction gas introduction steps (34, 35), deposition steps (31, 60) and a purge step 36. Because the reaction gas introduction steps and the purge step are the same as in the Deposition Sequence A shown in FIG. 2, descriptions are omitted. The deposition step of the Deposition Sequence D shown in FIG. 5 comprises the first deposition step 31 and the second deposition step 60. The first deposition step 31 is the same as the first deposition step 31 of the Deposition Sequence A. As for the Deposition Sequence D, in the second deposition step 60, while a flow rate of He is kept at a fixed flow, by decreasing only a flow rate of tetramethylsilane at a prescribed speed continuously to zero, a mixture ratio of the reaction gases is changed. Specifically, in the first deposition step 31, a mixture ratio of the reaction gases is about 100 sccm to about 1,000 sccm of tetramethylsilane to about 100 sccm to about 3,000 sccm of He; in the second deposition step 60, while a flow rate of He is kept at a fixed flow, a flow rate of tetramethylsilane is decreased to zero. Preferably, in the first deposition step 31, a mixture ratio of the reaction gases is about 200 sccm to about 500 sccm of tetramethylsilane to about 300 sccm to about 1,500 sccm of He; in the second deposition step 60, while a flow rate of He is kept at a fixed flow, a flow rate of tetramethylsilane is decreased to zero. More preferably, in the first deposition step 31, a mixture ratio of the reaction gases is about 200 sccm to about 500 sccm of tetramethylsilane to about 300 sccm to about 600 sccm of He; in the second deposition step 60, while a flow rate of He is kept at a fixed flow, a flow rate of tetramethylsilane is decreased to zero. In the second deposition step 60, a flow decrease rate of tetramethylsilane is determined by the execution time (at least about 3 seconds, preferably about 5 seconds to about 10 seconds) of the second deposition step 60 and a flow rate of tetramethylsilane.

Figure 6:
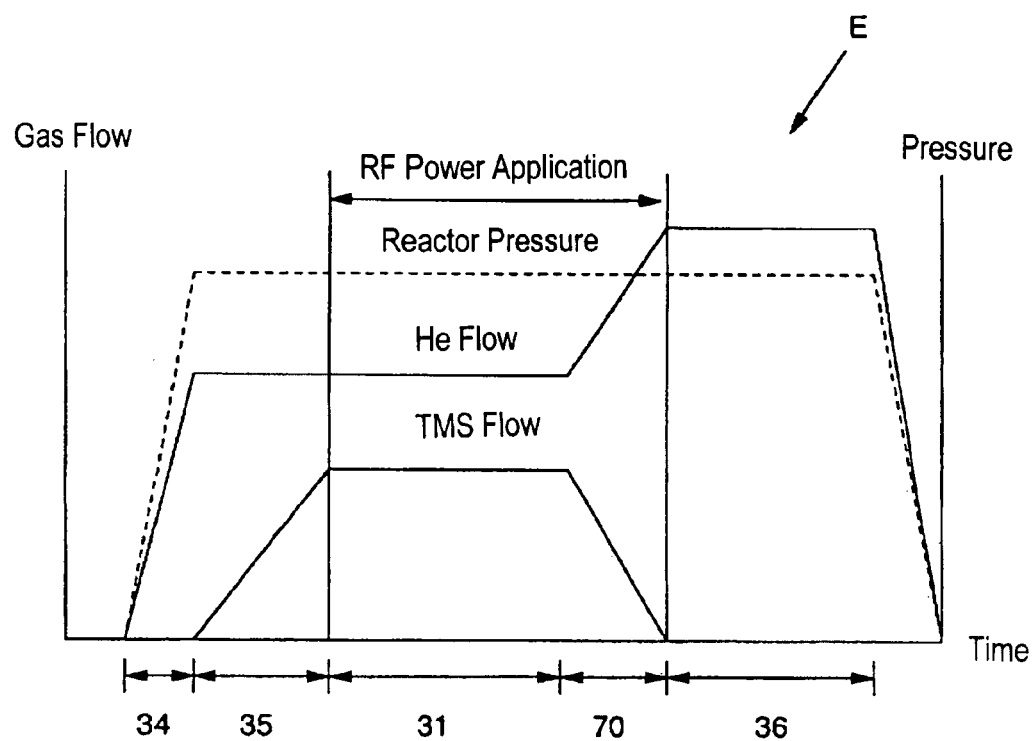
FIG. 6 is a diagram showing film formation control sequences (Sequence E) used for manufacturing a silicon carbide film according to still another embodiment of the present invention.

FIG. 6 shows a fifth embodiment of a deposition sequence used in the method of manufacturing the silicon carbide film according to the present invention. The Deposition Sequence E comprises reaction gas introduction steps (34, 35), deposition steps (31, 70) and a purge step 36. Because the reaction gas introduction steps and the purge step are the same as in the Deposition Sequence A shown in FIG. 2, descriptions are omitted. The deposition step of the Deposition Sequence E shown in FIG. 6 comprises the first deposition step 31 and the second deposition step 70. The first deposition step 31 is the same as the first deposition step 31 of the Deposition Sequence A. As for the Deposition Sequence E, in the second deposition step 70, by decreasing a flow rate of tetramethylsilane at a prescribed speed continuously to zero and at the same time increasing a flow rate of He at a prescribed speed continuously, a mixture ratio of the reaction gases is changed. Specifically, in the first deposition step 31, a mixture ratio of the reaction gases is about 100 sccm to about 1,000 sccm of tetramethylsilane to about 100 sccm to about 3,000 sccm of He; in the second deposition step 70, while a flow rate of tetramethylsilane is decreased to zero, a flow rate of He is increased up to about 500 sccm to about 10,000 sccm. Preferably, in the first deposition step 31, a mixture ratio of the reaction gases is about 200 sccm to about 500 sccm of tetramethylsilane to about 300 sccm to about 1,500 sccm of He; in the second deposition step 70, while a flow rate of tetramethylsilane is decreased to zero, a flow rate of He is increased up to about 1,000 sccm to about 5,000 sccm. More preferably, in the first deposition step 31, a mixture ratio of the reaction gases is about 200 sccm to about 500 sccm of tetramethylsilane to about 300 sccm to about 600 sccm of He; in the second deposition step 70, while a flow rate of tetramethylsilane is decreased to zero, a flow rate of He is increased to about 1,500 sccm to about 3,000 sccm. In the second deposition step 70, a flow decrease rate of tetramethylsilane and a flow increase rate of He are determined by the execution time (at least about 3 seconds, preferably about 5 seconds to about 10 seconds) of the second deposition step 70 and flow rates of tetramethylsilane and He in the first deposition step.

Flow rates of respective sequences mentioned above are applied when a silicon carbide film is deposited on a 200 mm silicon substrate. Application of the method according to the present invention, however, is not limited to 200 mm silicon substrates. If the method is applied to other sizes of substrates, flow rates of reaction gases are changed accordingly; a mixture ratio of the reaction gases, however, may be the same as mentioned in respective sequences.

EXAMPLES

The invention will be explained with reference to the following embodiments. However, the invention should not be limited to the embodiments.

Comparative experiments of silicon carbide films deposited by conventional methods and silicon carbide films deposited by the method according to embodiments of the present invention were conducted. Silicon carbide films were deposited on semiconductor substrates (200 mm silicon substrates) under the deposition conditions described below. The plasma CVD apparatus shown in FIG. 1 was used for the deposition process. As reaction gases, tetramethylsilane (TMS) and helium (He) were used except for Example 2 wherein TMS and Ar were used.

1) Comparative Example 1

| Deposition Temp. | TMS Flow Rate | He Flow Rate | Reaction Chamber Pressure | 27.12 MHz | 400 kHz |
|---|---|---|---|---|---|
| 360° C. | 700 sccm | 3,150 sccm | 665 Pa | 650 W | 180 W |

2) Comparative Example 2

| Deposition Temp. | TMS Flow Rate | He Flow Rate | Reaction Chamber Pressure | 27.12 MHz | 400 kHz |
|---|---|---|---|---|---|
| 330° C. | 700 sccm | 3,150 sccm | 665 Pa | 650 W | 180 W |

3) Comparative Example 3 He Plasma Process was Conducted for 15 sec. Immediately After the Deposition Step

| Deposition Temp. | TMS Flow Rate | He Flow Rate | Reaction Chamber Pressure | 27.12 MHz | 400 kHz |
|---|---|---|---|---|---|
| 330° C. | 700 sccm | 3,150 sccm | 665 Pa | 650 W | 180 W |

4) Example 1 Sequence F

First Deposition Step:

| Deposition Temp. | TMS Flow Rate | He Flow Rate | Reaction Chamber Pressure | 27.12 MHz | 400 kHz |
|---|---|---|---|---|---|
| 330° C. | 300 sccm | 500 sccm | 600 Pa | 400 W | 150 W |

Second Deposition Step (Execution time: 8 seconds):

| Deposition Temp. | TMS Flow Rate | He Flow Rate | Reaction Pressure Chamber | 27.12 MHz | 400 kHz |
|---|---|---|---|---|---|
| 330° C. | 0 sccm | 2,500 sccm | 600 Pa | 400 W | 150 W |

5) Example 2 Sequence F; Ar was Used as an Inert Gas

First Deposition Step:

| Deposition Temp. | TMS Flow Rate | Ar Flow Rate | Reaction Chamber Pressure | 27.12 MHz | 400 kHz |
|---|---|---|---|---|---|
| 330° C. | 300 sccm | 500 sccm | 600 Pa | 400 W | 150 W |

Second Deposition Step (Execution time: 8 seconds):

| Deposition Temp. | TMS Flow Rate | Ar Flow Rate | Reaction Chamber Pressure | 27.12 MHz | 400 kHz |
|---|---|---|---|---|---|
| 330° C. | 0 sccm | 2,500 sccm | 600 Pa | 400 W | 150 W |

Figure 7:
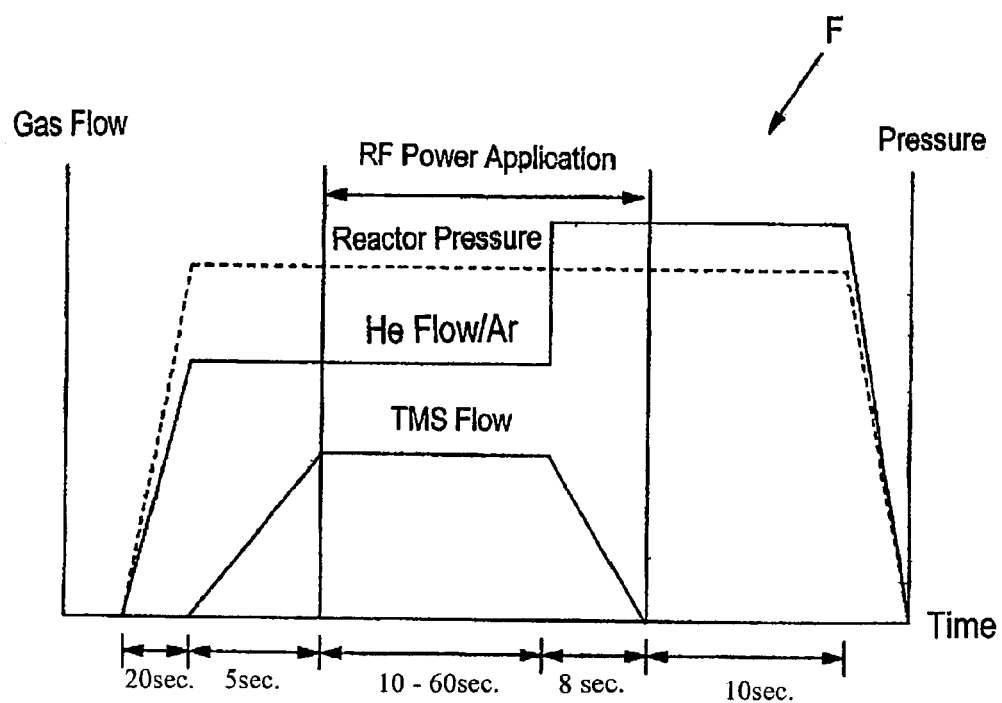
FIG. 7 is a diagram showing film formation control sequences (Sequence F) used for manufacturing a silicon carbide film according to yet another embodiment of the present invention.

In Examples 1 and 2, Sequence F was applied which is shown in FIG. 7. That is, the flow rate of the raw material gas was discontinuously increased, whereas the flow rate of the inert gas was continuously decreased to zero. As with the other figures, the axes of FIG. 7 are not accurately proportioned to the actual values. The time period (sec.) of each process is indicated with actual numbers in FIG. 7.

Experiments were conducted to evaluate characteristics of silicon carbide films deposited under the above-mentioned deposition conditions. The following characteristics were evaluated: dielectric constants of the films, change in film stress after the films were left in the atmosphere for one hour, change in film stress after a semiconductor substrate was heated up to 400° C. after the film had been deposited, and leakage current values when a voltage of 1 MV/cm was applied. Table 1 shows evaluation results of the characteristics of the silicon carbide films deposited under the above-mentioned deposition conditions.

TABLE 1

| | Dielectric constant | Stress Change in Atomsphere (MPa) | Stress Change before and after annealing (MPa) | Leakage Current ($\times 10^{-8}$ A/cm$^2$) |
|---|---|---|---|---|
| Comparative Example 1 | 4.9 | −10 | 480 | 8.6 |
| Comparative Example 2 | 4.7 | −65 | 370 | 1.7 |
| Comparative Example 3 | 4.7 | −15 | 375 | 1.0 |
| Example 1 | 3.8 | −3 | 100 | 0.20 |
| Example 2 | 3.9 | −5 | 50 | 0.15 |

From the evaluation results of the dielectric constants, as compared with the silicon carbide films in Comparative Examples 1 to 3 whose dielectric constants are high, which are 4 or higher, it is seen that the silicon carbide films of Examples 1 and 2, which were deposited by the method according to the present invention, attained low dielectric constants of 4 or lower.

From the evaluation results of the change in film stress in the atmosphere, it is seen that in the case of the silicon carbide film in the Comparative Example 2, its film quality was changed as the result of a film stress change only by 65 MPa in the direction of the pressure applied. As compared with the Comparative Example 2, in the case of the silicon carbide films in the Comparative Examples 1 and 3, their film stress changes in the atmosphere are small and the film stress appears to be relatively stable. As to the change in film stress before and after the heating, however, it is seen that film stress changes of above 300 Pa occurred in the silicon carbide films in any one of the Comparative Examples 1 to 3. In the manufacturing process of multilayer interconnects for LSI devices, because semiconductor substrates are exposed to an environment at approximately 400° C., there is a risk that a boundary of films contacting each other may exfoliate. Consequently, it can be said that the silicon carbide films in the Comparative Examples 1 to 3 are inadequate for use in LSI devices.

In contrast, in the case of silicon carbide films in the Examples 1 and 2, stress changes in the atmosphere hardly occurred at all and the films were exceedingly stable. Additionally, stress change before and after the heating was 100 MPa or less, which was extremely small as compared with the changes in the comparative examples. From these results, it is seen that the silicon carbide films in the Embodiments 1 and 2 have an extremely stable structure down to inside.

As to leakage current values, the Examples 1 and 2 show extremely small leakage values as compared with the Comparative Examples 1 to 3; the results tell that the silicon carbide films in the Examples 1 and 2 have high insulation performance. A leakage current level of a silicon carbide film which is applicable to LSI devices is preferably $1.0 \times 10^{-8}$ A/cm$^2$ or less when a voltage of 1 MV/cm is applied. The silicon carbide films in the Examples 1 and 2 meet this condition.

For the purpose of reference, under the deposition conditions in the Example 1, characteristics of a silicon carbide film without the second deposition step were examined. As a result, immediately after the deposition, its dielectric constant was 4.07 and its film stress was −98 MPa; after the film was left in the atmosphere for one week, the film's dielectric constant changed to 4.16 and its film stress changed to −300 MPa.

Effects

Using a method according to an embodiment of the present invention, a silicon carbide film having a dielectric constant of 4 or less, whose dielectric constant and film stress do not substantially change and are stable when it is left in the atmosphere, whose leakage current is small and which can be used as an etch stop film for copper wiring can be provided.

The silicon carbide film deposited by a method according to an embodiment of the present invention comprises Si, C, and H. Because this silicon carbide film has chemical composition different from that of a carbon-containing silicon oxide film (SiCOH) used as an interlayer insulating film for LSI devices, it is etched at an etching rate 10 times slower than that of the carbon-containing silicon oxide film. Consequently, it has become easy to form vias or trenches for copper wiring as designed.

The present application claims priority to Japanese Patent Application No. 2002-297260, filed Oct. 10, 2003, the disclosure of which is herein incorporated by reference in its entirety.

It will be understood by those of skill in the art that numerous and various modifications can be made without departing from the spirit of the present invention. Therefore, it should be clearly understood that the forms of the present invention are illustrative only and are not intended to limit the scope of the present invention.

What is claimed is:

1. A method for forming a silicon carbide film on a semiconductor substrate by plasma CVD, comprising the steps of:

(a) introducing a raw material gas containing silicon, carbon, and hydrogen in a molecule and an inert gas at a predetermined mixture ratio of the raw material gas to the inert gas into a reaction chamber;

(b) applying radio-frequency power to a reaction zone inside the reaction chamber at the mixture ratio, thereby forming on a semiconductor substrate a curable silicon carbide film having a dielectric constant of about 4.0 or higher; and (c) continuously applying radio-frequency power to the reaction zone at a mixture ratio which is reduced from that in step (b), thereby curing the curable silicon carbide film to reduce the dielectric constant of the curable silicon carbide film.

wherein the cured silicon carbide film has a stress change in the atmosphere or at 400° C. and a leakage current when 1 MV/cm voltage is applied, which are about less than ½ of those of the curable silicon carbide film.

2. The method according to claim 1, wherein the reduction of the mixture ratio is accomplished by (i) decreasing the flow rate of the raw material gas, (ii) increasing the flow rate of the inert gas, or (iii) both decreasing the flow rate of the raw material gas and increasing the flow rate of the inert gas.

3. The method according to claim 2, wherein the mixture ratio is constant before and after a point where the mixture ratio is discontinuously reduced.

4. The method as claimed in claim 1, wherein the mixture ratio of the raw material gas to the inert gas after the reduction, is about zero.

5. The method according to claim 1, wherein the raw material gas comprises tetramethylsilane or trimethylsilane.

6. The method according to claim 1, wherein the inert gas comprises helium, argon, neon, xenon or krypton.

7. The method according to claim 1, wherein the radio-frequency power is comprised of low frequency power and high-frequency power.

8. The method according to claim 7, wherein the low frequency power is power having a frequency of less than 2 MHz and high frequency power is power having a frequency of no less than 2 MHz.

9. The method according to claim 1, wherein a time period for the curing is about 5 seconds to about 10 seconds per the curable silicon carbide film having a thickness of about 30 nm to about 100 nm.

10. The method according to claim 1, wherein the flow rate of the raw material gas and the flow rate of the inert gas before the reduction of the mixture ratio are about 100 sccm to about 1,000 sccm and about 100 sccm to about 3,000 sccm, respectively.

11. The method according to claim 1, wherein the silicon carbide film is an etch stop film.

12. A method for forming a silicon carbide film on a semiconductor substrate by plasma CVD, comprising the steps of:

(a) introducing a raw material gas containing silicon, carbon, and hydrogen in a molecule and an inert gas at a predetermined mixture ratio of the raw material gas to the inert gas into a reaction chamber;

(b) applying radio-frequency power to a reaction zone inside the reaction chamber at the mixture ratio, thereby forming on a semiconductor substrate a curable silicon carbide film having a dielectric constant of about 4.0 or higher; and (c) continuously applying radio-frequency power to the reaction zone at a mixture ratio which is reduced from that in step (b), thereby curing the curable silicon carbide film to reduce the dielectric constant of the curable silicon carbide film, wherein the silicon carbide film is made of a Si—C—H material.

13. A method for forming a silicon carbide film on a semiconductor substrate by plasma CVD, comprising the steps of:

(a) introducing a raw material gas containing silicon, carbon, and hydrogen and an inert gas at a predetermined mixture ratio of the raw material gas to the inert gas into a reaction chamber;

(b) applying radio-frequency power to a reaction zone inside the reaction chamber at the mixture ratio, thereby forming on a semiconductor substrate a curable silicon carbide film having a dielectric constant of about 4.0 or higher; and (c) continuously applying radio-frequency power to the reaction zone at a mixture ratio which is reduced from that in step (b), thereby curing the silicon carbide film to give a dielectric constant lower than that of the curable silicon carbide film, wherein the reduction of the mixture ratio is accomplished by (i) decreasing the flow rate of the raw material gas, (ii) increasing the flow rate of the inert gas, or (iii) both decreasing the flow rate of the raw material gas and increasing the flow rate of the inert gas, wherein the mixture ratio is constant before a point where the mixture ratio is reduced, and the mixture ratio is continuously reduced after the point.

14. A method for forming a silicon carbide film on a semiconductor substrate by plasma CVD, comprising the steps of:

(a) introducing a raw material gas containing silicon, carbon, and hydrogen in a molecule and an inert gas at a predetermined mixture ratio of the raw material gas to the inert gas into a reaction chamber;

(b) applying radio-frequency power to a reaction zone inside the reaction chamber at the mixture ratio, thereby forming on a semiconductor substrate a curable silicon carbide film having a dielectric constant of about 4.0 or higher; and (c) continuously applying radio-frequency power to the reaction zone at a mixture ratio which is reduced from that in step (b), thereby curing the curable silicon carbide film to reduce the dielectric constant of the curable silicon carbide film.

wherein the mixture ratio of the raw material gas to the inert gas after the reduction, is about 1/5 to about 1/100.

15. The method according to claim 14, wherein the mixture ratio of the raw material gas to the inert gas before the reduction, is about 1/1 to about 1/3.

16. A method for forming a silicon carbide film on a semiconductor substrate by plasma CVD, comprising the steps of:

(a) introducing a raw material gas containing silicon, carbon, and hydrogen and an inert gas at a predetermined mixture ratio of the raw material gas to the inert gas into a reaction chamber;

(b) applying radio-frequency power to a reaction zone inside the reaction chamber at the mixture ratio, thereby forming on a semiconductor substrate a curable silicon carbide film having a dielectric constant of about 4.0 or higher; and (c) continuously applying radio-frequency power to the reaction zone at a mixture ratio which is reduced from that in step (b), thereby curing the silicon carbide film to give a dielectric constant lower than that of the curable silicon carbide film, said method further comprising stabilizing the reaction zone prior to the film formation, wherein the flow rate of the raw material gas and the flow rate of the inert gas are increased from zero until reaching a predetermined mixture ratio by a ramp-up method.

* * * * *